(12) United States Patent
Chen et al.

(10) Patent No.: US 11,177,154 B2
(45) Date of Patent: Nov. 16, 2021

(54) CARRIER STRUCTURE AND MICRO DEVICE STRUCTURE

(71) Applicant: PixeLED Display CO., LTD., Hsinchu County (TW)

(72) Inventors: Pei-Hsin Chen, Hsinchu County (TW); Yi-Chun Shih, Hsinchu County (TW); Yi-Ching Chen, Hsinchu County (TW); Ying-Tsang Liu, Hsinchu County (TW); Yu-Chu Li, Hsinchu County (TW); Huan-Pu Chang, Hsinchu County (TW); Chih-Ling Wu, Hsinchu County (TW); Yu-Yun Lo, Hsinchu County (TW); Tzu-Yang Lin, Hsinchu County (TW); Yu-Hung Lai, Hsinchu County (TW)

(73) Assignee: PixeLED Display CO., LTD., Hsinchu County (TW)

( * ) Notice: Subject to any disclaimer, the term of this patent is extended or adjusted under 35 U.S.C. 154(b) by 0 days.

(21) Appl. No.: 16/224,811

(22) Filed: Dec. 19, 2018

(65) Prior Publication Data
US 2019/0189496 A1 Jun. 20, 2019

Related U.S. Application Data

(60) Provisional application No. 62/607,325, filed on Dec. 19, 2017.

(30) Foreign Application Priority Data

Dec. 5, 2018 (TW) .................................. 107143613

(51) Int. Cl.
*H01L 21/68* (2006.01)
*H01L 21/683* (2006.01)
(Continued)

(52) U.S. Cl.
CPC .......... *H01L 21/6835* (2013.01); *B65G 47/90* (2013.01); *H01L 25/0753* (2013.01);
(Continued)

(58) Field of Classification Search
CPC ............. H01L 21/6835; H01L 25/0753; H01L 2221/68309; H01L 2221/68354;
(Continued)

(56) References Cited

U.S. PATENT DOCUMENTS

| 2016/0118333 A1* | 4/2016 | Lin | H01L 24/96 257/773 |
| 2017/0047306 A1* | 2/2017 | Meitl | H01L 24/95 |

FOREIGN PATENT DOCUMENTS

| CN | 106601657 | 4/2017 |
| CN | 107425101 | 12/2017 |
| CN | 107452840 | 12/2017 |

OTHER PUBLICATIONS

"Office Action of Taiwan Counterpart Application", dated May 9, 2019, pp. 1-6.

* cited by examiner

*Primary Examiner* — Ronald P Jarrett
(74) *Attorney, Agent, or Firm* — JCIPRNET

(57) ABSTRACT

A carrier structure suitable for transferring or supporting a plurality of micro devices including a carrier and a plurality of transfer units is provided. The transfer units are disposed on the carrier. Each of the transfer units includes a plurality of transfer parts. Each of the transfer parts has a transfer surface. Each of the micro devices has a device surface. The transfer surfaces of the transfer parts of each of the transfer units are connected to the device surface of corresponding micro device. The area of each of the transfer surfaces is smaller than the area of the device surface of the corre-
(Continued)

1E sponding micro device. A micro device structure using the carrier structure is also provided.

26 Claims, 14 Drawing Sheets

(51) Int. Cl.
*B65G 47/90* (2006.01)
*H01L 25/075* (2006.01)
*H01L 33/62* (2010.01)

(52) U.S. Cl.
CPC .... *H01L 33/62* (2013.01); *H01L 2221/68309* (2013.01); *H01L 2221/68354* (2013.01); *H01L 2221/68363* (2013.01); *H01L 2221/68368* (2013.01); *H01L 2933/0066* (2013.01)

(58) Field of Classification Search
CPC ........... H01L 2221/68363; H01L 2221/68368; B65G 47/90
See application file for complete search history.

CARRIER STRUCTURE AND MICRO DEVICE STRUCTURE

CROSS-REFERENCE TO RELATED APPLICATION

This application claims the priority benefit of U.S. provisional application Ser. No. 62/607,325, filed on Dec. 19, 2017, and Taiwan application serial no. 107143613, filed on Dec. 5, 2018. The entirety of each of the above-mentioned patent applications is hereby incorporated by reference herein and made a part of this specification.

BACKGROUND OF THE INVENTION

Field of the Invention

The invention relates to a carrier structure and a micro device structure, and more particularly, to a carrier structure suitable for transferring or supporting a micro device and a micro device structure using the carrier structure.

Description of Related Art

In recent years, the manufacturing cost of an organic light-emitting diode (OLED) display panel has been high and its lifetime cannot compete with current mainstream displays, and therefore a micro light-emitting diode display (micro LED display) has gradually attracted investment from various technology companies. The micro light-emitting diode display has optical performance equivalent to that of organic light-emitting diode display techniques, such as high color saturation, fast response speed, and high contrast, and has the advantages of low energy consumption and long material life. However, in current techniques, the micro light-emitting diode display is still more expensive to manufacture than the organic light-emitting diode display. The main reason is that the manufacturing technique of the micro light-emitting diode display uses a die transfer method to directly transfer manufactured micro light-emitting diode dies onto a driver circuit backplate. Although such a mass transfer technique in large-scale product manufacture has its development advantages, the current related process techniques and equipment all have bottlenecks to be broken.

Current methods of extraction used in die transfer techniques include the use of an electrostatic force, van der Waals forces, and viscous materials. In particular, the method of electrostatic force requires the use of a higher external voltage, and therefore the risk of arcing and dielectric breakdown is higher. The adhesion and desorption of the dies extracted by using van der Waals force depend on the rate at which an elastomer polymer stamper comes in contact with the dies. Therefore, more precise control is needed for the operation of the stamper, and the success rate of transfer is not high. The transfer method involving the use of a viscous material to bond the dies has the disadvantages of uneven adhesion, instability, and poor alignment accuracy. Moreover, when the dies are arranged on a transfer carrier via a support structure, since the support structure is mostly disposed on the peripheral surface of the dies, the dies cannot be densely arranged on the transfer carrier to efficiently perform mass transfer. Therefore, how to solve the above technical bottlenecks and reduce production costs is one of the issues that various technology companies are currently working on.

SUMMARY OF THE INVENTION

The invention provides a carrier structure with good process latitude.

The invention provides a micro device structure with good supporting force for micro devices.

The carrier structure of the invention is suitable for transferring or supporting a plurality of micro devices. The carrier structure includes a carrier and a plurality of transfer units. The transfer units are disposed on the carrier. Each of the transfer units includes a plurality of transfer parts. Each of the transfer parts has a transfer surface. Each of the micro devices has a device surface. The transfer surfaces of the transfer parts of each of the transfer units is connected to the device surface of the corresponding micro device. The area of each of the transfer surfaces is smaller than the area of the device surface of the corresponding micro device.

The micro device structure of the invention includes a carrier structure and a plurality of micro devices. The carrier structure includes a carrier and a plurality of transfer units. The transfer units are disposed on the carrier. Each of the transfer units includes a plurality of transfer parts. Each of the transfer parts has a transfer surface. Each of the micro devices has a device surface. The transfer surfaces of the transfer parts of each of the transfer units is connected to the device surface of the corresponding micro device. The area of each of the transfer surfaces is smaller than the area of the device surface of the corresponding micro device.

In an embodiment of the invention, the ratio of the area of each of the transfer surfaces to the area of the device surface of the corresponding micro device is between 0.2 and 0.8.

In an embodiment of the invention, the Young's modulus of each of the transfer parts of the micro device structure is less than the Young's modulus of the carrier structure and the Young's modulus of the corresponding micro device.

In an embodiment of the invention, the overlapped area of the transfer surface of one of the transfer parts of each of the transfer units and the device surface of the corresponding micro device is greater than the overlapped area of the transfer surface of another transfer part and the device surface of the corresponding micro device.

In an embodiment of the invention, the orthographic projection of the plurality of transfer parts of each of the transfer units of the micro device structure on the carrier structure is defined as a transfer region. The ratio of the area of the transfer region to the area of the device surface of the corresponding micro device is greater than or equal to 0.5 and less than or equal to 1.5.

In an embodiment of the invention, any two adjacent transfer units of the micro device structure have a first spacing. Any two adjacent micro devices have a second spacing, and the ratio of first spacing to second spacing is between 0.5 and 1.5.

In an embodiment of the invention, the ratio of the first spacing of the micro device structure to the width of each of the micro devices is less than or equal to 0.5.

In an embodiment of the invention, the carrier of the carrier structure has a carrier surface and a plurality of grooves. The plurality of grooves are located on the carrier surface of the carrier, and the plurality of transfer parts are respectively disposed in the plurality of grooves.

In an embodiment of the invention, the transfer surface of each of the transfer parts of the carrier structure is aligned with the carrier surface.

In an embodiment of the invention, the transfer surface of each of the transfer parts of the carrier structure is protruded from the carrier surface.

In an embodiment of the invention, the ratio of the height of the transfer part of the carrier structure protruded from the carrier surface to the height of the transfer part is less than or equal to 0.8.

In an embodiment of the invention, each of the transfer parts of the carrier structure further has a connection surface connected to the carrier, and the roughness of each of the transfer surfaces is greater than the roughness of the corresponding connection surface.

In an embodiment of the invention, each of the transfer units of the carrier structure has at least one housing space, and the plurality of transfer parts of each of the transfer units surround at least one corresponding housing space.

In an embodiment of the invention, the plurality of transfer units of the carrier structure are connected to one another.

Based on the above, the carrier structure of an embodiment of the invention may be used for transferring micro devices, or as a temporary substrate for placing micro devices, and by providing a plurality of transfer parts to the transfer units connected to the micro devices and making the area of the transfer surface of each of the transfer parts smaller than the area of the device surface of each of the micro devices, each of the micro devices is stressed more evenly during the transfer process, and the process latitude of the transfer process is increased. In addition, the micro device structure using the carrier structure may increase the supporting force of the micro devices.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
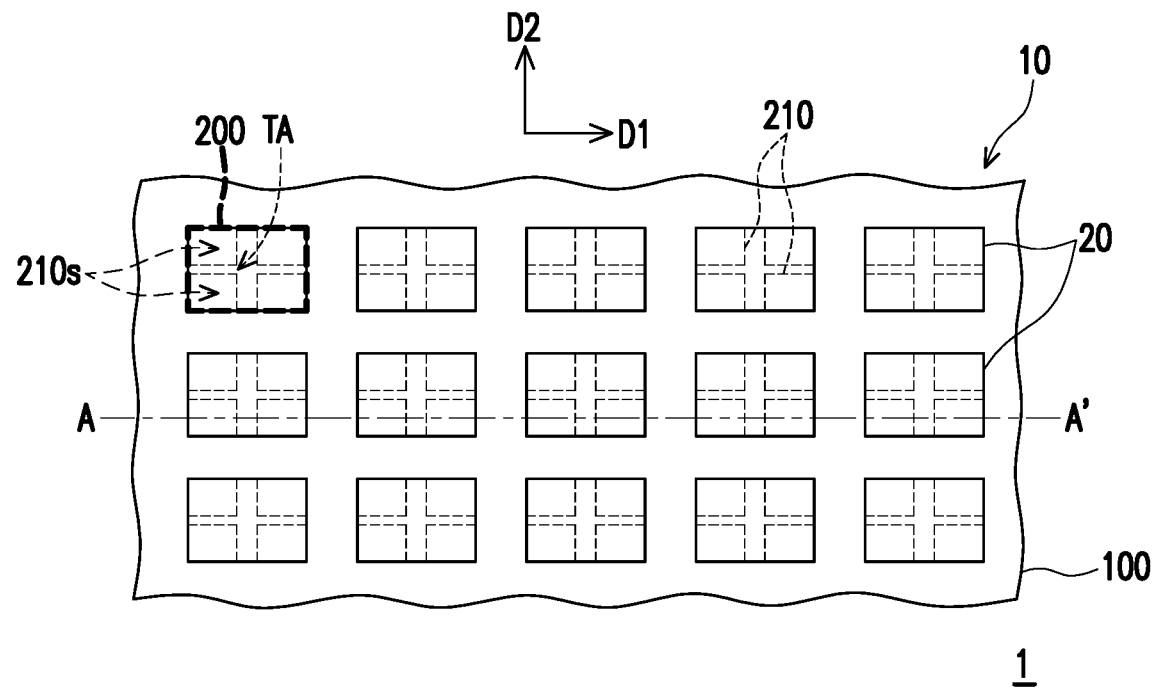
FIG. 1 is a bottom view of the micro device structure of the first embodiment of the invention.

Hereinafter, exemplary embodiments of the invention are described in detail, and examples of the exemplary embodiments are conveyed via the figures. Wherever possible, the same reference numerals are used in the figures and the descriptions to refer to the same or similar portions.

Figure 2:
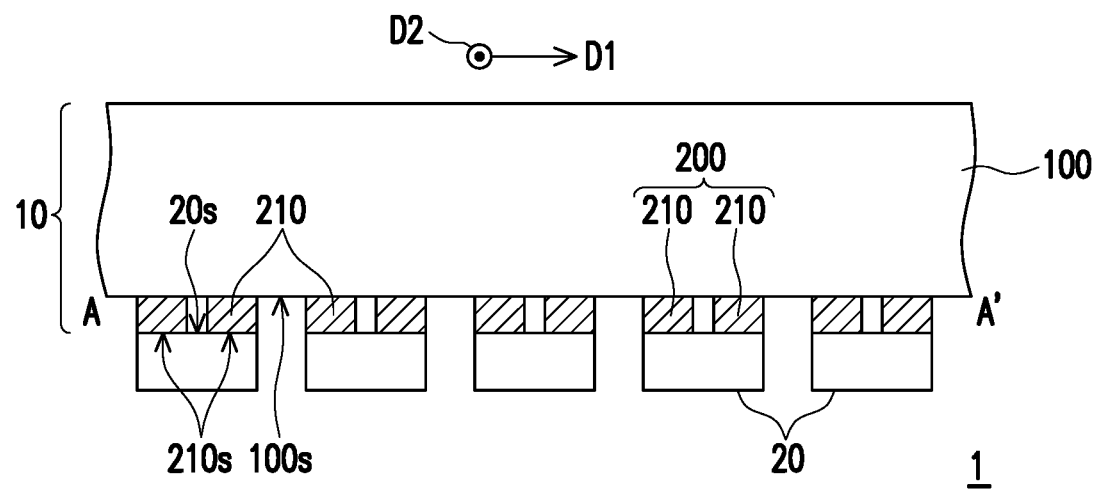
FIG. 2 is a cross section of the micro device structure of FIG. 1.

FIG. 1 is a bottom view of a micro device structure 1 of the first embodiment of the invention. FIG. 2 is a cross section of the micro device structure 1 of FIG. 1. In particular, FIG. 2 corresponds to section line A-A' of FIG. 1.

Referring to FIG. 1 and FIG. 2, the micro device structure 1 includes a carrier structure 10 and a plurality of micro devices 20. The carrier structure 10 is suitable for transferring the plurality of micro devices 20. The carrier structure 10 includes a carrier 100 and a plurality of transfer units 200. The plurality of transfer units 200 are disposed on the carrier 100. In detail, in the present embodiment, the plurality of transfer units 200 may be arranged in an array on a surface 100s of the carrier 100, but the invention is not limited thereto. Each of the micro devices 20 has a device surface 20s. The plurality of transfer units 200 are respectively used to connect the plurality of device surfaces 20s of the plurality of micro devices 20. Specifically, each of the transfer units 200 is used to connect the device surface 20s of one corresponding micro device 20.

Each of the transfer units 200 includes a plurality of transfer parts 210. Each of the transfer parts 210 has a transfer surface 210s for connecting the device surface 20s of the corresponding micro device 20. In particular, the area of the transfer surface 210s of each of the transfer parts 210 is smaller than the area of the device surface 20s of each of the micro devices 20. In the present embodiment, the ratio of the area of the transfer surface 210s of each of the transfer parts 210 to the area of the device surface 20s of each of the micro devices 20 may be between 0.2 and 0.8. When the ratio is less than 0.2, the micro device 20 is unevenly stressed during transfer, and when the ratio is greater than 0.8, the micro device 20 is difficult to be transferred and occupies too much transfer space, but the invention is not limited thereto. That is to say, the ratio of the area of the transfer surface 210s of each of the transfer parts 210 to the area of the device surface 20s of each of the micro devices 20 is between 0.2 and 0.8, so that each of the micro devices 20 is stressed more evenly during the transfer process and the process latitude of the transfer process is improved.

It should be noted that the orthographic projection of each of the transfer parts 210 on the carrier 100 may optionally be rectangular, circular, elliptical, or other suitable shapes. For example, in the present embodiment, the orthographic projection of each of the transfer parts 210 on the carrier 100 is a rectangle and has the largest dimension in a direction D1. However, the invention is not limited thereto, and according to other embodiments, each of the transfer parts 210 may also have the largest dimension in a direction D2. In particular, the largest dimension may be less than or equal to 30 μm. In a preferred embodiment, the maximum size of each of the transfer parts 210 may be less than or equal to 10 μm. It is worth mentioning that by adjusting the size and distribution density of the transfer parts 210, the connection force of each of the transfer units 200 and the micro devices 20 may be changed to meet different transfer process conditions. For example, when the surfaces of the micro devices are flat surfaces, the transfer parts 210 have a smaller distribution density and may effectively bear the micro devices and easily and more efficiently transfer the micro devices; when the surfaces of the micro devices have a height difference, the distribution density of the transfer parts 210 is greater, so that the micro devices are stressed more evenly during the transfer process. Here, for example, each of the transfer units 200 is connected to the micro device 20 via adhesion or other physical forces such as electrostatic force or magnetic force, but the invention is not limited thereto.

Each of the transfer units 200 has a transfer region TA, and the transfer region TA is the smallest area that covers the orthographic projections of all of the transfer parts 210 of each of the transfer units 200 on the carrier 100. For example, in the present embodiment, the orthographic area of the transfer region TA of each of the transfer units 200 on the carrier 100 is substantially equal to the area of the device surface 20s of the corresponding micro device 20, but the invention is not limited thereto.

In the present embodiment, the Young's modulus of each of the transfer parts 210 may be optionally smaller than the Young's modulus of the carrier 100 and the Young's modulus of each of the micro devices 20 to prevent damage to the micro devices 20 during the transfer process from being pressed by the transfer part 210. That is to say, each of the transfer parts 210 may also have buffer function. In the present embodiment, the transfer part 210 may be viscous, that is, the material of the transfer part 210 may include a viscous material. The viscous material is, for example, an organic material (for example, benzocyclobutene, phenol formaldehyde resin, epoxy resin, polyisoprene rubber, or a combination thereof), an inorganic material (such as silicon oxide, silicon nitride, silicon oxynitride, or a combination thereof), or a thermally modified material (such as a cold brittle material, hot melt material, photoresist material, or a combination thereof). In particular, the viscosity of the viscous material may vary with different temperatures. For example, the higher the temperature, the greater the viscosity of the adhesive, but the invention is not limited thereto. According to other embodiments not shown, each of the transfer parts may optionally include a viscous connection layer (not shown), and the connection layer (not shown) is disposed on the transfer surface of each of the transfer parts to connect the device surface 20s of the corresponding micro device 20 and may be used as a buffer for transfer or supporting.

In the present embodiment, the micro device 20 is, for example, a micro semiconductor device having a photon function, such as a micro light-emitting diode, a micro laser diode, or a micro photodiode, but the invention is not limited thereto. In another embodiment, the micro device 20 may also be a micro semiconductor having controllable execution of predetermined electronic functions, such as a micro diode, a micro transistor, a micro integrated circuit, or a micro sensor. In yet another embodiment, the micro device 20 may also be a microchip with circuitry, such as a microchip made of a Si or SOI wafer for a logic or memory application, or a microchip made of a GaAs wafer for RF communication applications. In the present embodiment, the micro device 20 is, for example, a flip-chip micro semiconductor device (flip chip). However, in an embodiment not shown, the micro device 20 may also be a vertical micro semiconductor device (vertical chip), but the invention is not limited thereto.

Figure 3A:
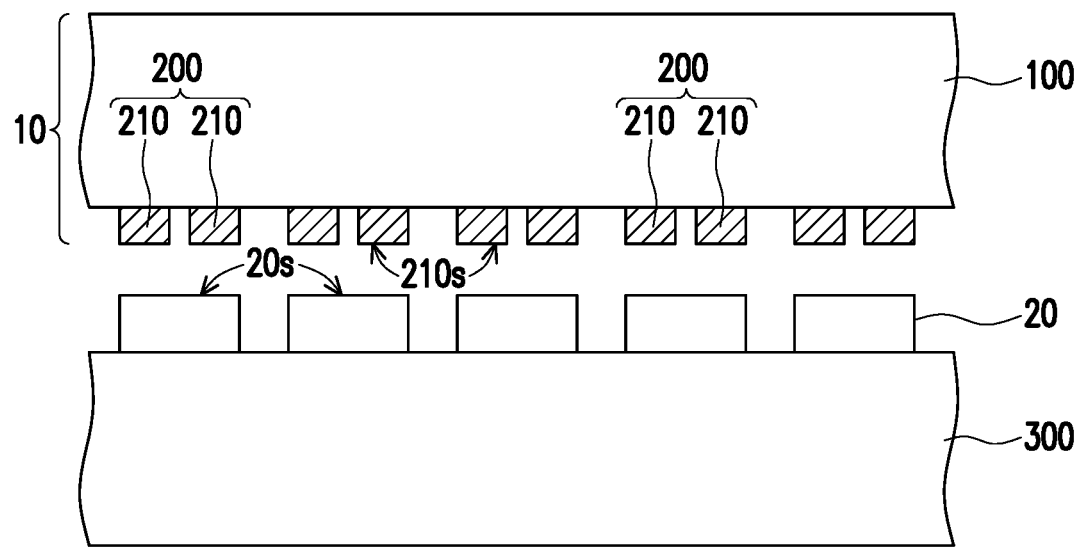
FIG. 3A to FIG. 3E are flowcharts showing a carrier structure of the first embodiment of the invention for transferring micro devices.
Figure 3B:
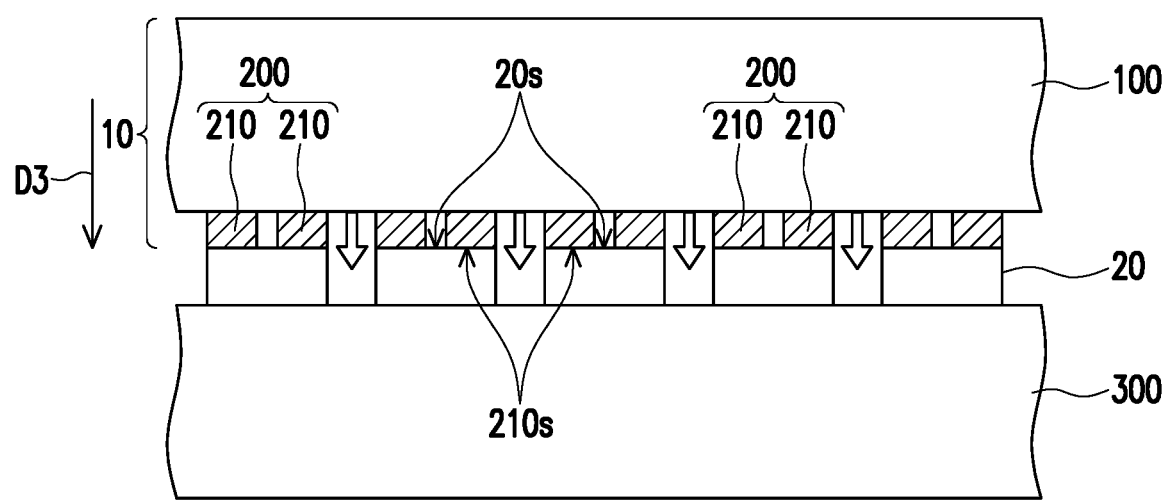

FIG. 3A to FIG. 3E are flowcharts showing the carrier structure 10 of the first embodiment of the invention for transferring the micro devices 20. Referring to FIG. 3A, first, a temporary substrate 300 and a plurality of micro devices 20 are provided, wherein the plurality of micro devices 20 are arranged on the temporary substrate 300 in an array. The carrier structure 10 of FIG. 2 may also be used as a temporary substrate for placing the micro devices, but the invention is not limited thereto. A carrier structure 10 is provided, wherein each of the transfer units 200 corresponds to one of the micro devices 20. Referring to FIG. 3B, next, the carrier structure 10 is brought closer to the temporary substrate 300 along a direction D3, and the carrier structure 10 is connected to device surfaces 20s of the plurality of micro devices 20 via the plurality of transfer units 200. Specifically, each of the transfer units 200 is connected to the device surface 20s of one corresponding micro device 20 via a plurality of transfer surfaces 210s of a plurality of transfer parts 210. Here, the temporary substrate 300 may be a temporary substrate such as a sapphire substrate, a glass substrate, or a plastic substrate and may be used as a temporary carrier to support the micro devices 20 without a working circuit, but the invention is not limited thereto.

Figure 3C:
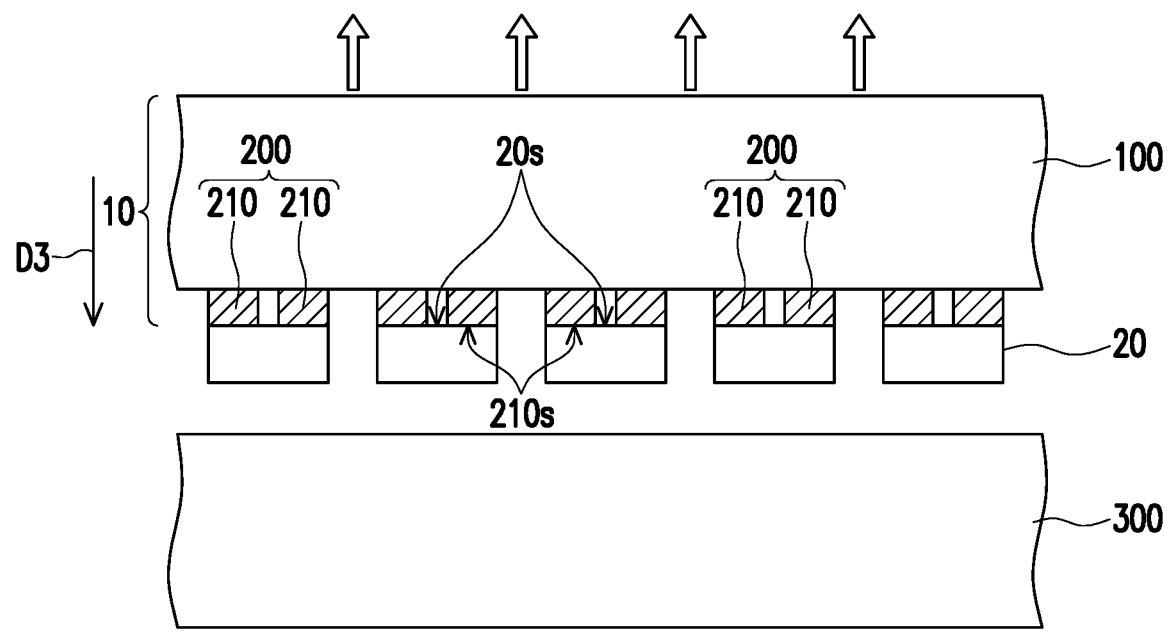

For example, when the plurality of transfer units 200 are respectively connected to the device surfaces 20s of the plurality of micro devices 20, the plurality of transfer parts 210 of the plurality of transfer units 200 may be optionally heated such that the viscosity of the transfer surface 210s of each of the transfer parts 210 connected to the device surfaces 20s of the micro devices 20 is increased to improve the adhesion of each of the transfer parts 210, but the invention is not limited thereto. Referring to FIG. 3C, next, the carrier 100 of the carrier structure 10 is moved away from the temporary substrate 300 along the opposite direction of the direction D3, and the plurality of micro devices 20 are respectively moved away from the temporary substrate 300 via the plurality of transfer units 200.

Figure 3D:
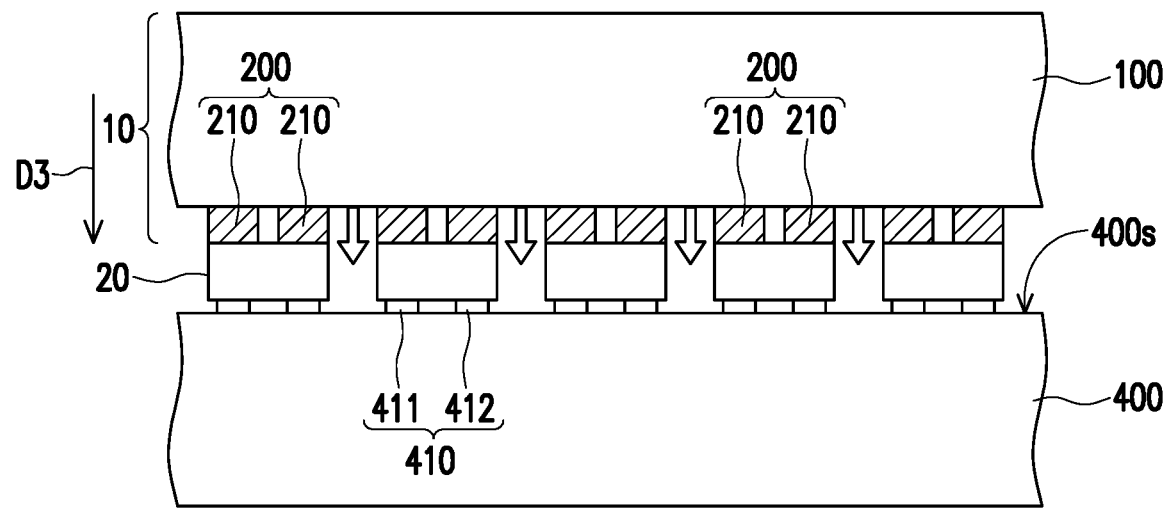

Referring to FIG. 3D, next, a target substrate 400 is provided, and the carrier 100 of the carrier structure 10 is brought closer to the target substrate 400 along the direction D3 such that the plurality of micro devices 20 are bonded to the target substrate 400. In particular, the target substrate 400 is, for example, a pixel array substrate for display, and has a plurality of bonding pad sets 410 arranged in an array on the surface 400s of the target substrate 400. In detail, each of the bonding pad sets 410 includes a first bonding pad 411 and a second bonding pad 412, and a first electrode (not shown) and a second electrode (not shown) of each of the micro devices 20 (e.g., micro light-emitting diodes) are respectively bonded to the first bonding pad 411 and the second bonding pad 412 of the target substrate 400. However, the invention is not limited thereto. According to other embodiments, the target substrate 400 may also be a printed circuit board (PCB), a display substrate, a light-emitting substrate, a substrate having a functional device such as a thin-film transistor or an integrated circuit (ICs), or other types of circuit substrates, but the invention is not limited thereto.

Figure 3E:
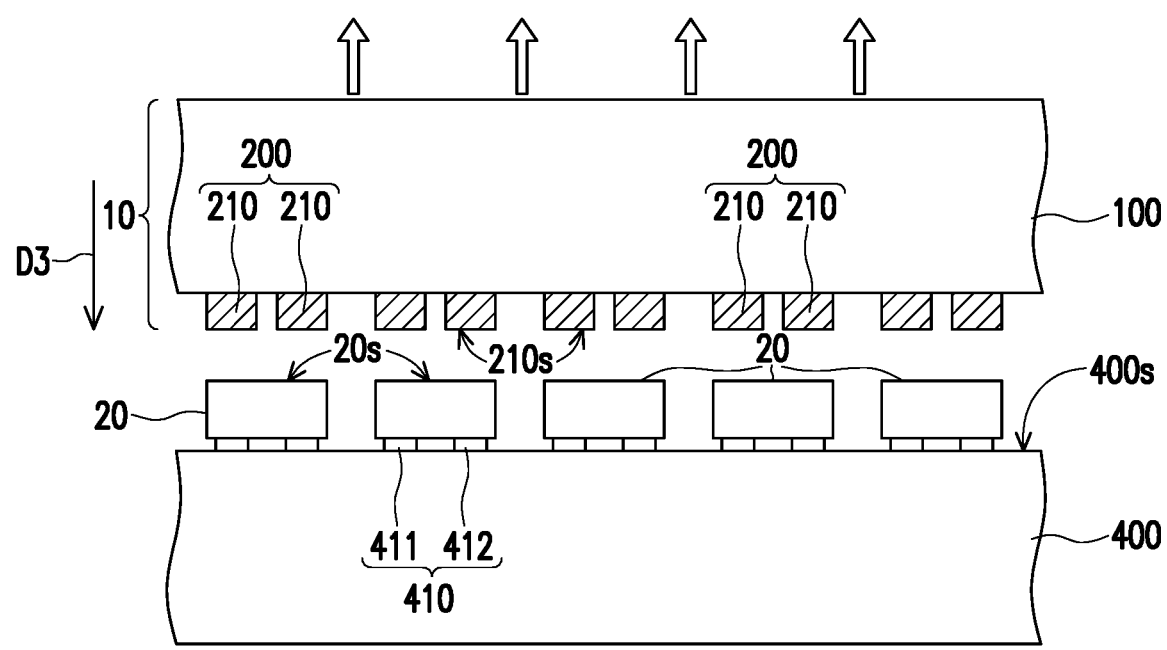

Referring to FIG. 3E, after each of the micro devices 20 is bonded to the target substrate 400, the carrier 100 of the carrier structure 10 is moved away from the target substrate 400 along the opposite direction of the direction D3, so that the plurality of transfer units 200 are respectively separated from the plurality of micro devices 20. At this point, the transfer process of the plurality of micro devices 20 is completed.

Figure 4:
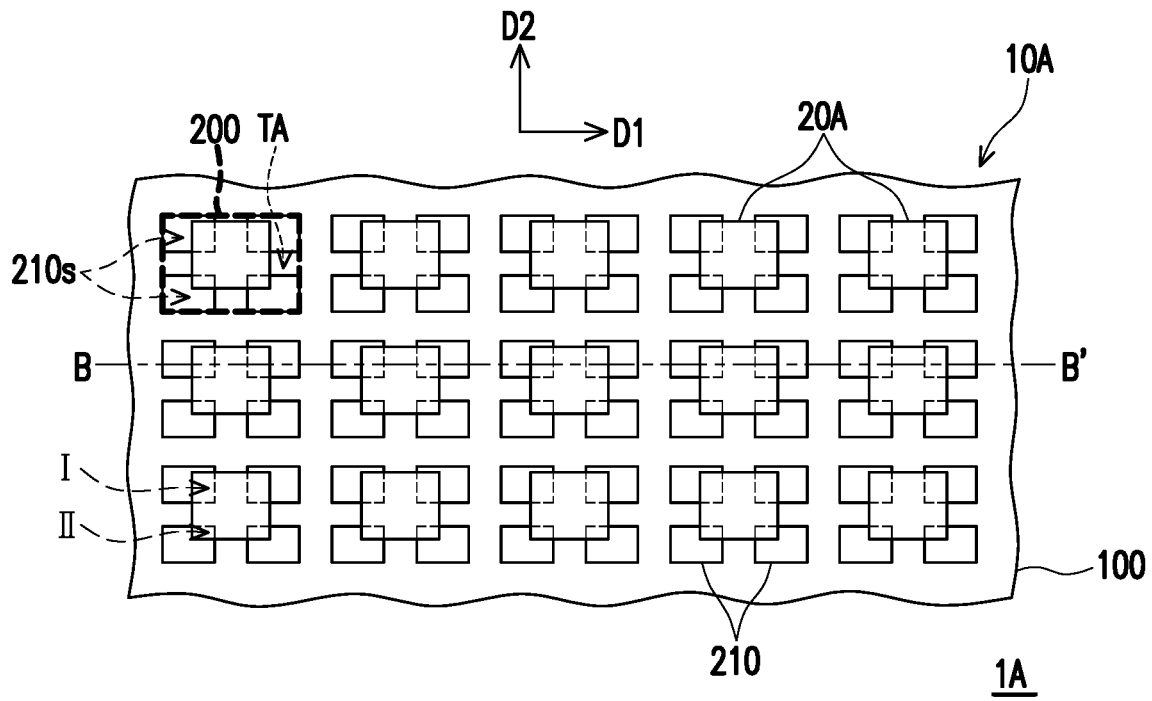
FIG. 4 is a bottom view of the micro device structure of the second embodiment of the invention.
Figure 5:
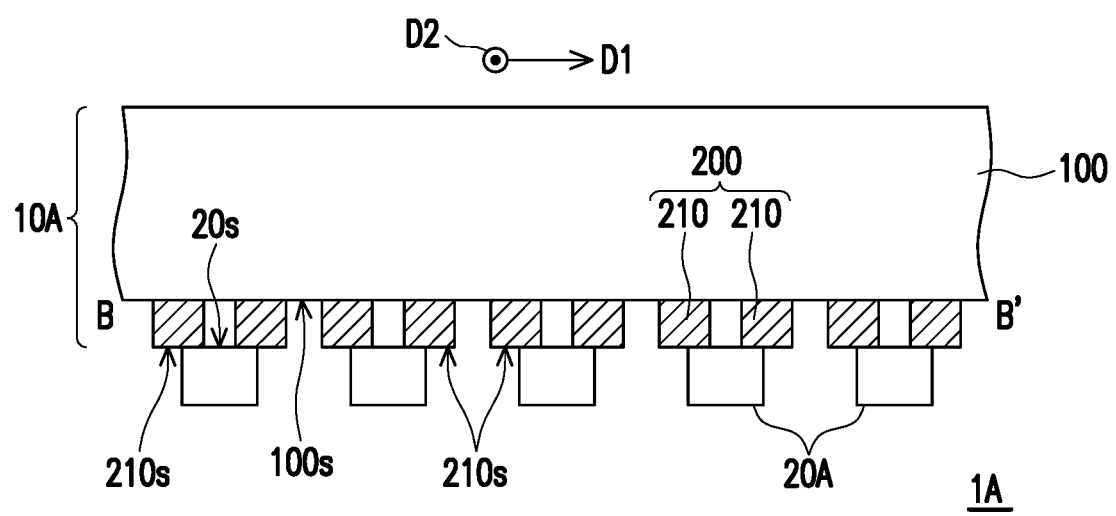
FIG. 5 is a cross section of the micro device structure of FIG. 4.

FIG. 4 is a bottom view of a micro device structure 1A of the second embodiment of the invention. FIG. 5 is a cross section of the micro device structure 1A of FIG. 4. In particular, FIG. 5 corresponds to section line B-B' of FIG. 4.

Referring to FIG. 4 and FIG. 5, the micro device structure 1A includes a carrier structure 10A. The difference between the carrier structure 10A of the present embodiment and the carrier structure 10 of FIG. 1 is that the orthogonal projection area of the transfer region TA of each of the transfer units 200 of the carrier structure 10A of the present embodiment on the carrier 100 is greater than the area of the device surface 20s of a corresponding micro device 20A. Here, the size of the micro device 20A is, for example, less than or equal to 20 μm, and a greater misalignment latitude is required, but the invention is not limited thereto. In detail, during the transfer process of the micro device 20A, an overlapped area I of one of the transfer parts 210 of each of the transfer units 200 and the micro device 20A is greater than an overlapped area II of another transfer part 210 of each of the transfer units 200 and the micro device 20A. That is, when each of the transfer units 200 of the carrier structure 10A is aligned with the corresponding micro device 20A, a shift in the direction D2 is generated. Nevertheless, the plurality of micro devices 20A may still have sufficient supporting force to enhance the transfer yield of the plurality of micro devices 20A. In other words, the misalignment latitude of the carrier structure 10A in the transfer process (for example, the misalignment in the direction D2 and/or the direction D1) may also be increased.

It should be mentioned that, in the present embodiment, by making the ratio of the orthographic projection area of the transfer region TA of each of the transfer units 200 on the carrier 100 to the area of the device surface 20s of a corresponding micro device 20A greater than 1 and less than or equal to 1.5, the misalignment latitude of the carrier structure 10A in the transfer process may be increased, and each of the transfer units 200 is prevented from occupying too much space of the carrier 100.

Figure 6:
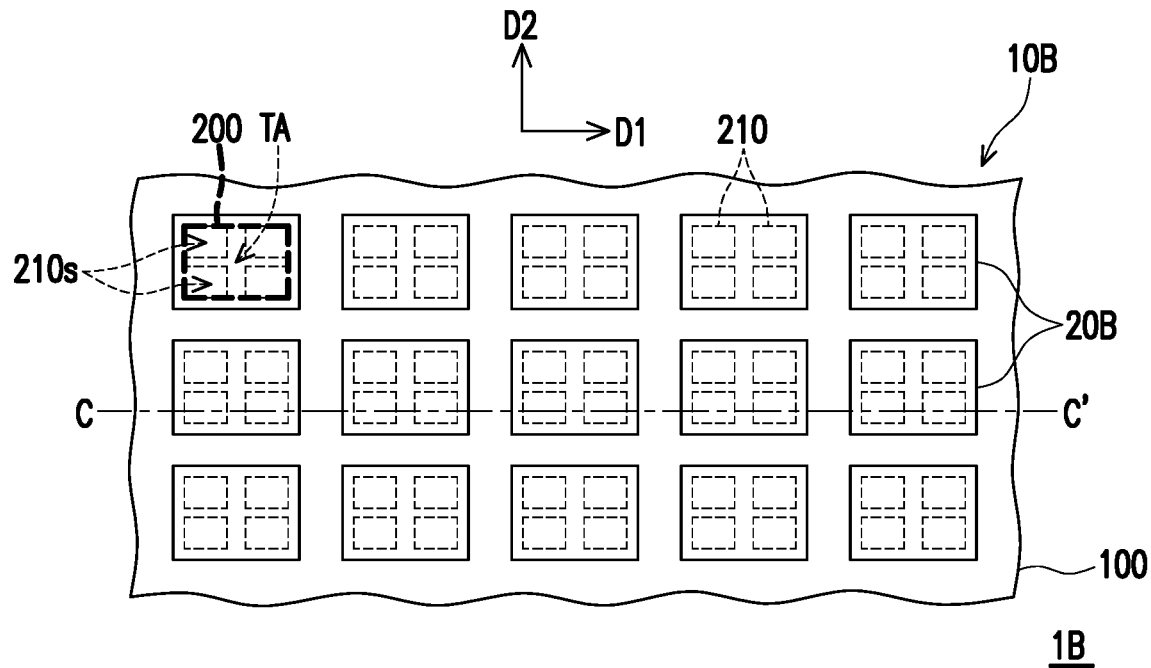
FIG. 6 is a bottom view of the micro device structure of the third embodiment of the invention.
Figure 7:
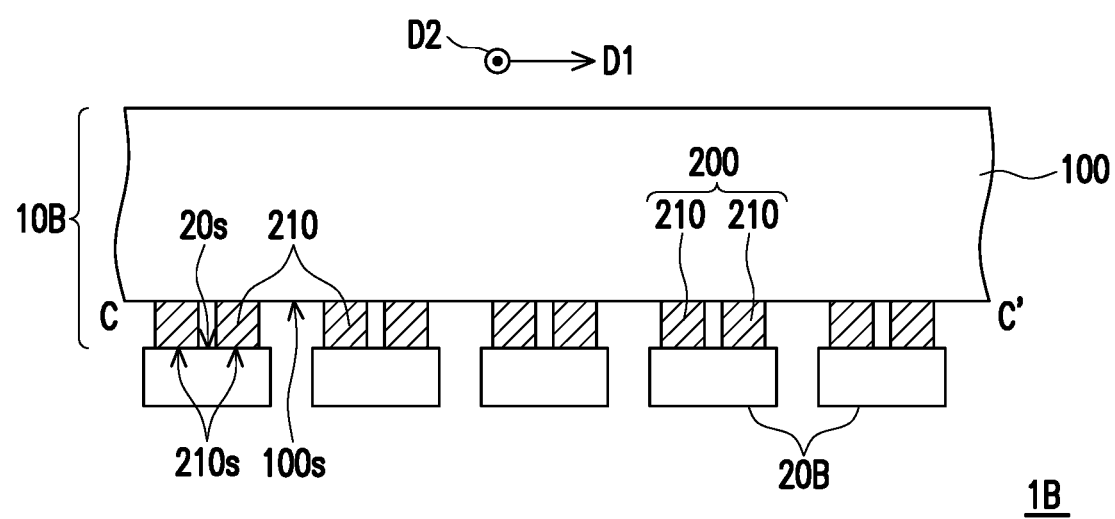
FIG. 7 is a cross section of the micro device structure of FIG. 6.

FIG. 6 is a bottom view of a micro device structure 1B of the third embodiment of the invention. FIG. 7 is a cross section of the micro device structure 1B of FIG. 6. In particular, FIG. 7 corresponds to section line C-C' of FIG. 6.

Referring to FIG. 6 and FIG. 7, the micro device structure 1B includes a carrier structure 10B. The difference between the carrier structure 10B of the present embodiment and the carrier structure 10A of FIG. 4 is that the orthogonal projection area of the transfer region TA of each of the transfer units 200 of the carrier structure 10B of the present embodiment on the carrier 100 is less than the area of the device surface 20s of the corresponding micro device 20B. In particular, in the present embodiment, by making the ratio of the orthographic projection area of the transfer region TA of each of the transfer units 200 on the carrier 100 to the area of the device surface 20s of the corresponding micro device 20B greater than or equal to 0.5 and less than 1, the plurality of micro devices 20B may have sufficient supporting force, and each of the transfer units 200 may be prevented from being brought in contact with a non-corresponding micro device 20B. Here, the size of the micro device 20B is, for example, greater than or equal to 20 μm, and a smaller transfer region TA may prevent each of the transfer units 200 from being brought in contact with a non-corresponding micro device 20B, but the invention is not limited thereto.

Figure 8:
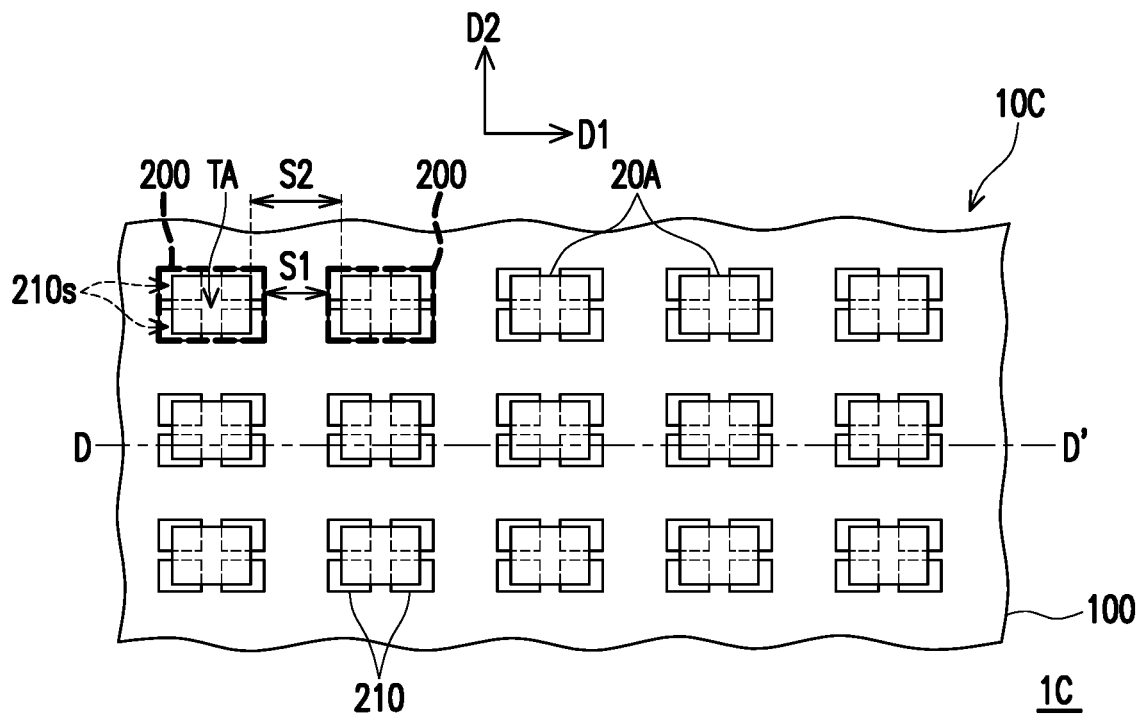
FIG. 8 is a bottom view of the micro device structure of the fourth embodiment of the invention.
Figure 9:
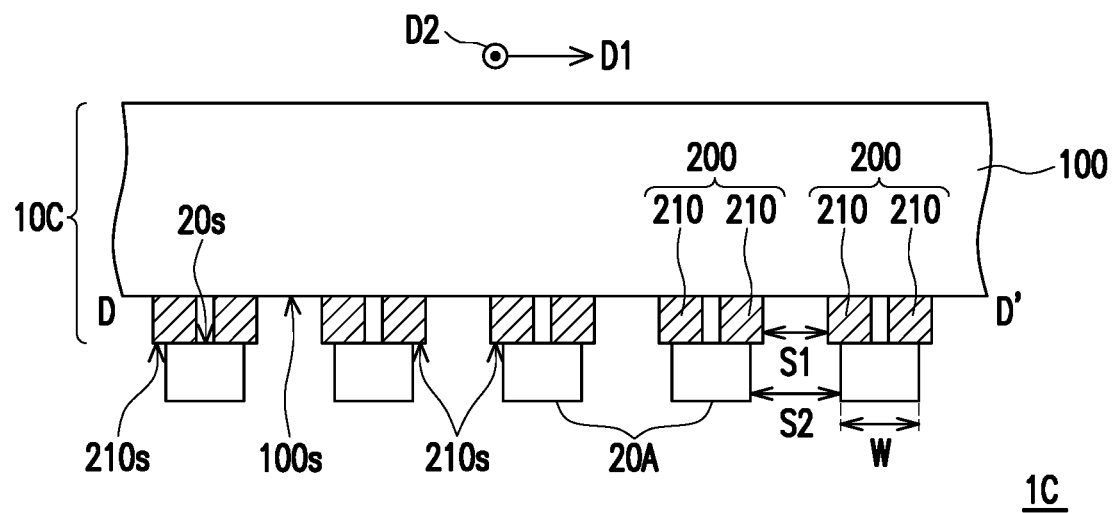
FIG. 9 is a cross section of the micro device structure of FIG. 8.

FIG. 8 is a bottom view of a micro device structure 1C of the fourth embodiment of the invention. FIG. 9 is a cross section of the micro device structure 1C of FIG. 8. In particular, FIG. 9 corresponds to section line D-D' of FIG. 8.

Referring to FIG. 8 and FIG. 9, the micro device structure 1C includes a carrier structure 10C. Any two adjacent transfer units 200 of the carrier structure 10C have a shortest distance, and this distance is a first spacing S1, and any two adjacent micro devices 20A have a shortest distance, and this distance is a second spacing S2. In the present embodiment, the ratio of the first spacing S1 of any two adjacent transfer units 200 to the second spacing S2 of any two adjacent micro devices 20A is between 0.5 and 1.5. In particular, when the size of the micro device 20A is, for example, less than or equal to 20 μm, the ratio of the first spacing S1 of any two adjacent transfer units 200 to the second spacing S2 of any two adjacent micro devices 20A is greater than or equal to 0.5 and less than 1, and therefore the misalignment latitude of the carrier structure 10C in the transfer process (for example, the misalignment in the direction D2 and/or the direction D1) may be increased, but the invention is not limited thereto. When the size of the micro device 20A is, for example, greater than or equal to 20 μm, the ratio of the first spacing S1 of any two adjacent transfer units 200 to the second spacing S2 of any two adjacent micro devices 20A is greater than 1 and less than or equal to 1.5, and therefore each of the transfer units 200 may be prevented from being brought in contact with a non-corresponding micro device 20A, but the invention is not limited thereto. In particular, in the present embodiment, the ratio of the first spacing S1 of any two adjacent transfer units 200 to a width W of each of the micro devices 20A is less than or equal to 0.5. When greater than 0.5, an excessive space of the carrier 100 is occupied, so that the micro devices 20A cannot be densely arranged on the carrier 100.

Figure 10:
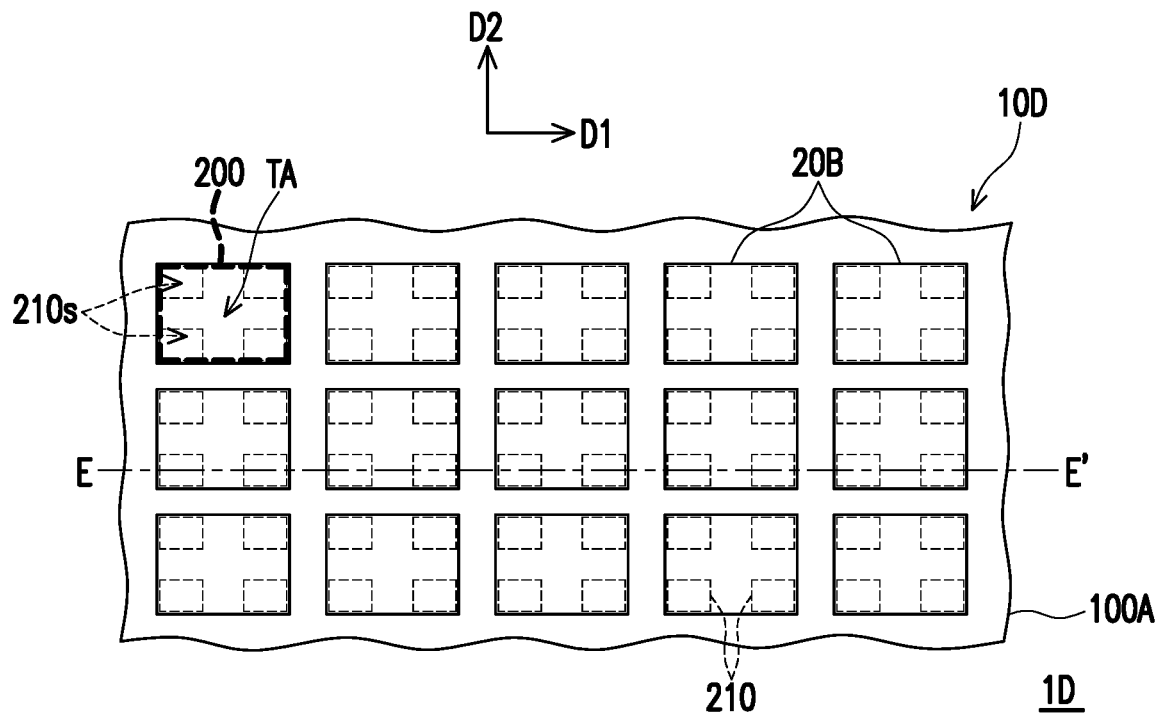
FIG. 10 is a bottom view of the micro device structure of the fifth embodiment of the invention.
Figure 11:
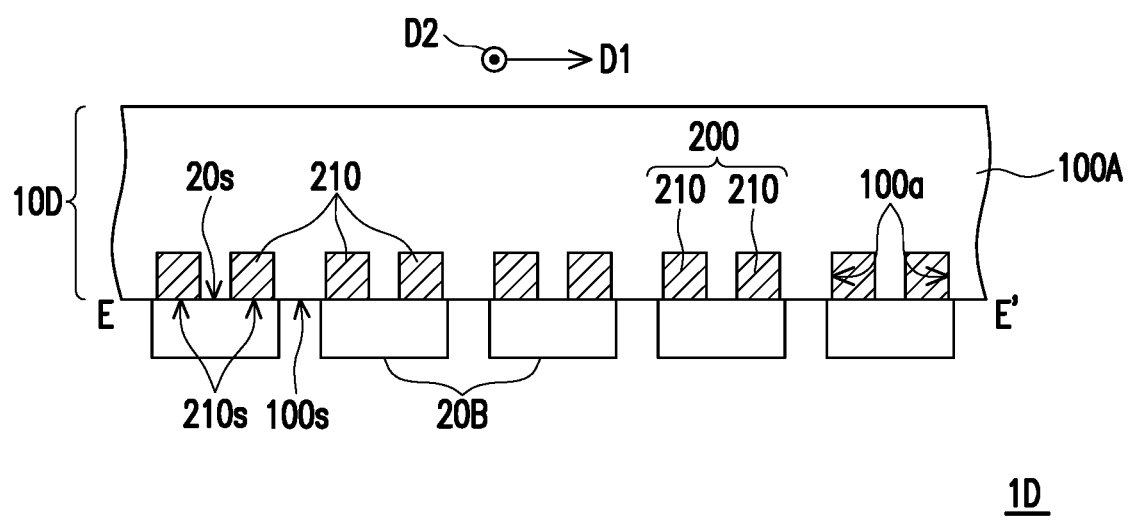
FIG. 11 is a cross section of the micro device structure of FIG. 10.

FIG. 10 is a bottom view of a micro device structure 1D of the fifth embodiment of the invention. FIG. 11 is a cross section of the micro device structure 1D of FIG. 10. FIG. 11 corresponds to section line E-E' of FIG. 10.

Referring to FIG. 10 and FIG. 11, the micro device structure 1D includes a carrier structure 10D. Compared to the carrier structure 10 of FIG. 1, a carrier 100A of the carrier structure 10D of the present embodiment further includes a plurality of grooves 100a disposed on the surface 100s of the carrier 100A. In particular, a plurality of transfer parts 210 of a plurality of transfer units 200 are respectively disposed in the plurality of grooves 100a of the carrier 100A and expose a transfer surface with respect to the surface 100s of the carrier 100A. For example, in the present embodiment, by aligning a transfer surface 210s of each of the transfer parts 210 with the surface 100s of the carrier 100A, the area of contact between the transfer part 210 and the carrier 100A may be increased, and the transfer parts 210 may be evenly heated via the carrier 100A to perform a subsequent transfer process, but the invention is not limited thereto.

Figure 12:
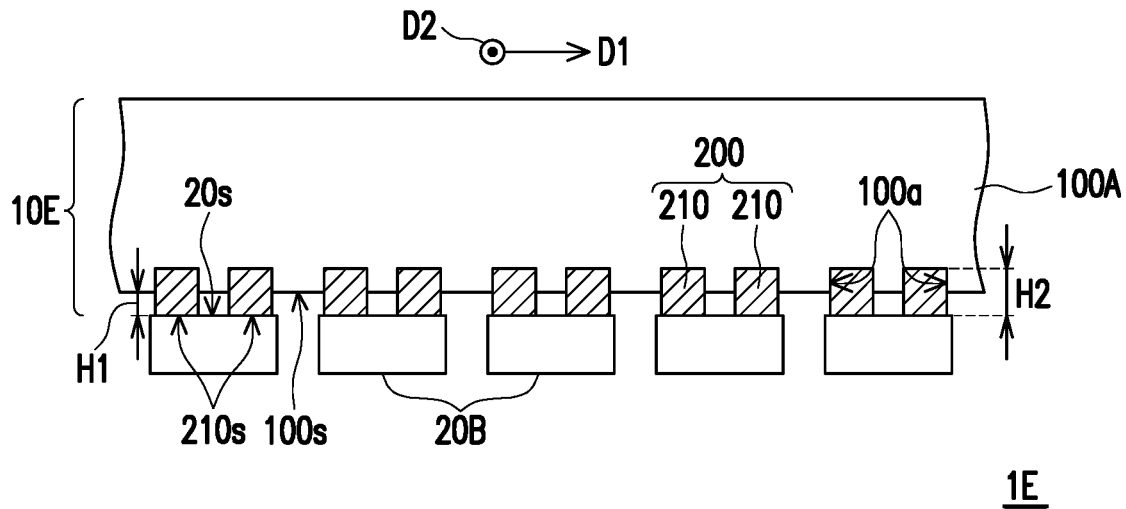
FIG. 12 is a cross section of the micro device structure of the sixth embodiment of the invention.

FIG. 12 is a cross section of a micro device structure 1E of the sixth embodiment of the invention. Referring to FIG. 12, the micro device structure 1E includes a carrier structure 10E. The difference between the carrier structure 10E of the present embodiment and the carrier structure 10D of FIG. 11 is that the transfer surface 210s of each of the transfer parts 210 of the carrier structure 10E is protruded from the surface 100s of the carrier 100A (or there is a height difference between the surface 210s of each of the transfer parts 210 and the surface 100s of the carrier 100A) to effectively prevent damage to the micro device 20B by the pressing of the transfer part 210 during the transfer process. That is to say, each of the transfer parts 210 of the carrier structure 10E has buffer function. Moreover, the transfer surface 210s of each of the transfer parts 210 is protruded from the surface 100s of the carrier 100A, and therefore the buffer space around each of the transfer parts 210 in the bonding process during transfer may be increased. Specifically, the transfer part 210 protruded from the surface 100s of the carrier 100A has a height H1, and the ratio of the height H1 to a height H2 of each of the transfer parts 210 is less than or equal to 0.8. When greater than 0.8, the supporting force of the transfer part 210 to the micro device 20 may be insufficient, such that damage readily occurs.

Figure 13:
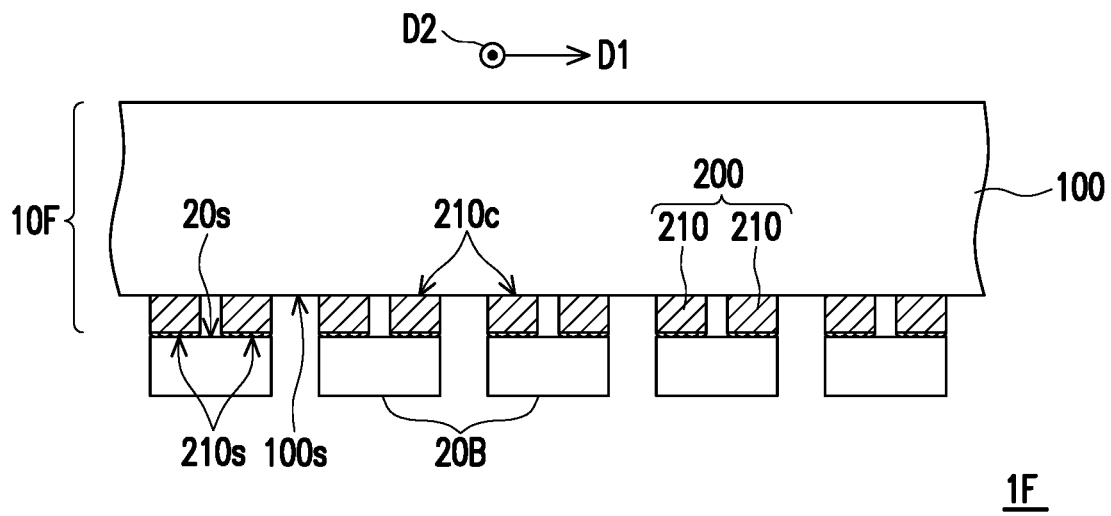
FIG. 13 is a cross section of the micro device structure of the seventh embodiment of the invention.

FIG. 13 is a cross section of a micro device structure 1F of the seventh embodiment of the invention. Referring to FIG. 13, the micro device structure 1F includes a carrier structure 10F. Each of the transfer parts 210 of the carrier structure 10F has a connection surface 210c connected to the carrier 100, and the roughness of the transfer surface 210s of each of the transfer parts 210 is greater than the roughness of the corresponding connection surface 210c. In particular, by adjusting the roughness of each of the transfer surfaces 210s, the amount of adhesion between each of the transfer parts 210 and the corresponding micro device 20B may be changed. For example, by increasing the roughness of each of the transfer surfaces 210s, the adhesion between each of the transfer parts 210 and the corresponding micro device 20B may be smaller, such that the carrier structure 10F is easier to be separated after the micro device 20B is bonded to the target substrate.

Figure 14:
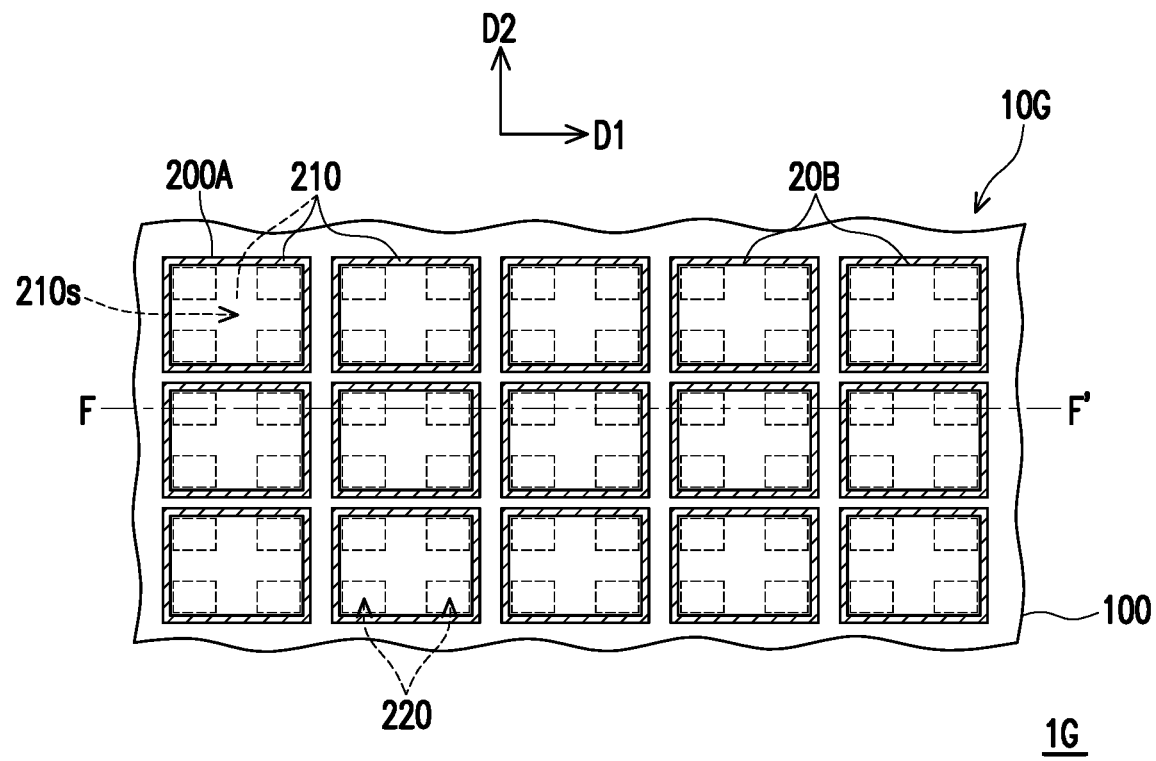
FIG. 14 is a bottom view of the micro device structure of the eighth embodiment of the invention.
Figure 15:
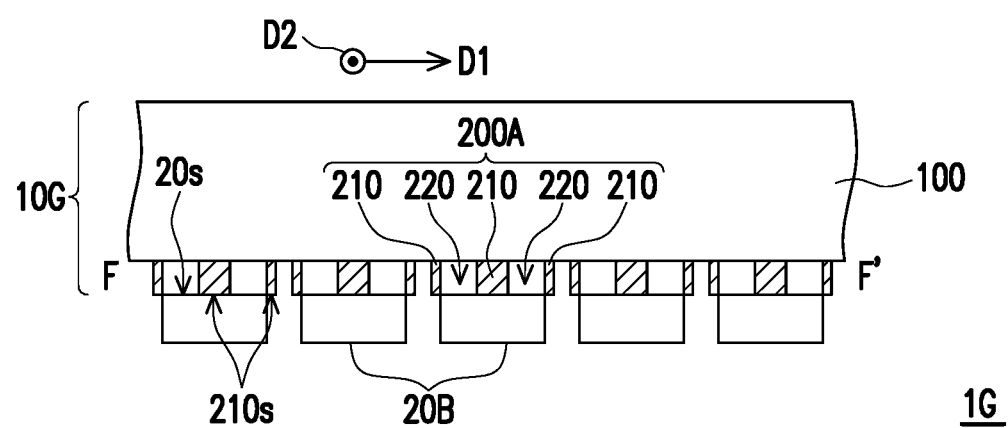
FIG. 15 is a cross section of the micro device structure of FIG. 14.

FIG. 14 is a bottom view of a micro device structure 1G of the eighth embodiment of the invention. FIG. 15 is a cross section of the micro device structure 1G of FIG. 14. In particular, FIG. 15 corresponds to section line F-F' of FIG. 14.

Referring to FIG. 14 and FIG. 15, the micro device structure 1G includes a carrier structure 10G. Each of the transfer units 200A of the carrier structure 10G has at least one housing space 220, and the plurality of transfer parts 210 of each of the transfer units 200A surround at least one corresponding housing space 220. For example, in the present embodiment, each of the transfer units 200A has four housing spaces 220 and is overlapped with the corresponding micro device 20B. It is worth mentioning that, by adjusting the size and distribution density of the housing space 220, the connection force of each of the transfer units 200A may be changed to meet different transfer process conditions. For example, when the surfaces of the micro devices are flat surfaces, the housing space 220 has a greater distribution density, and therefore the micro devices may be effectively born and the micro devices may be easily and more efficiently transferred; when the surfaces of the micro devices have a height difference, the distribution density of the housing space 220 is smaller, and the micro devices may be stressed more evenly during the transfer process.

Figure 16:
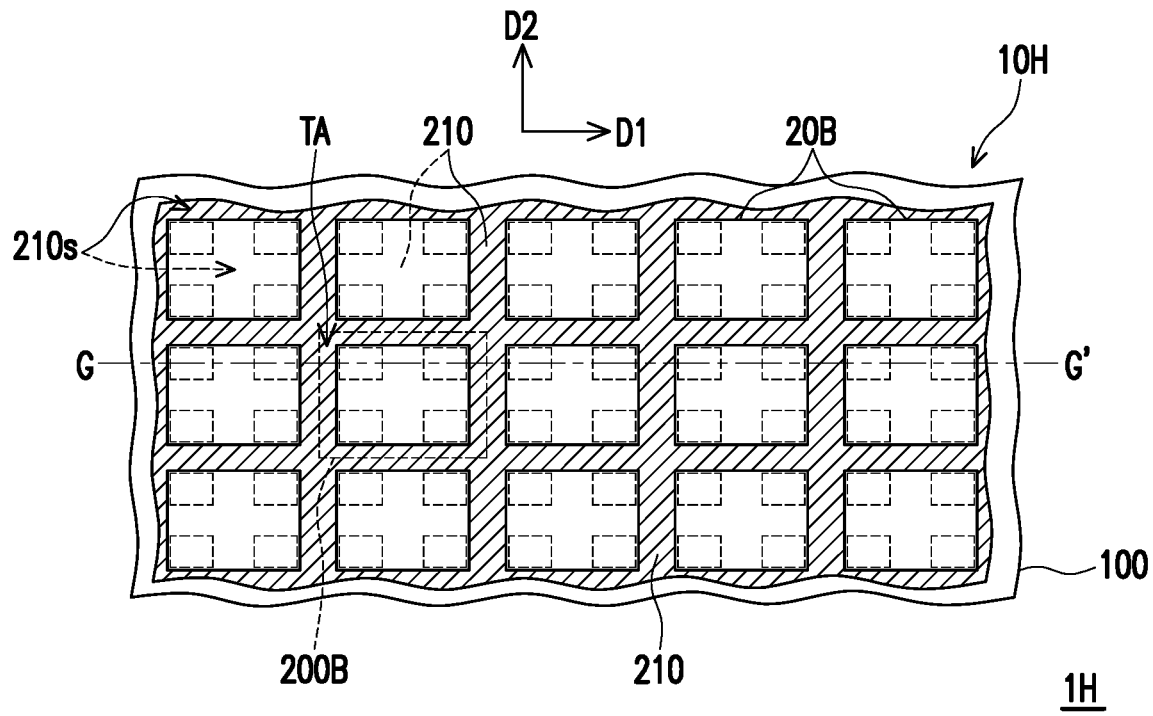
FIG. 16 is a bottom view of the micro device structure of the ninth embodiment of the invention.
Figure 17:
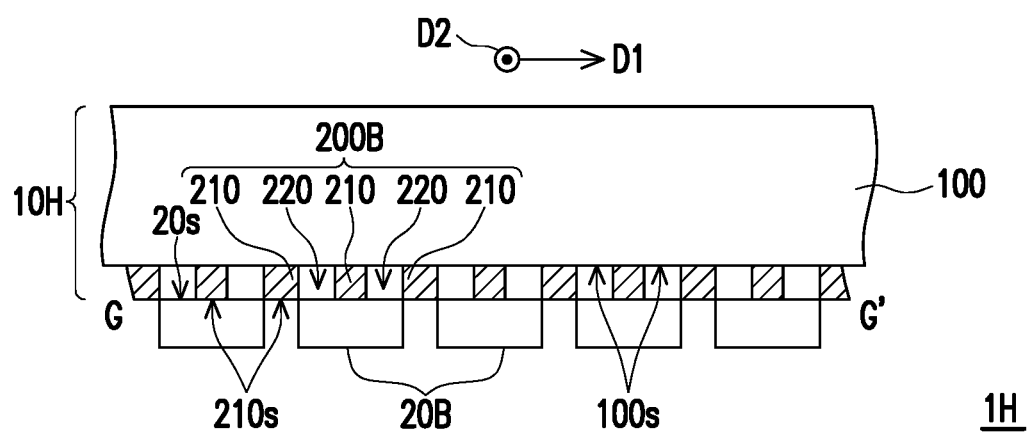
FIG. 17 is a cross section of the micro device structure of FIG. 16.
Figure 18A:
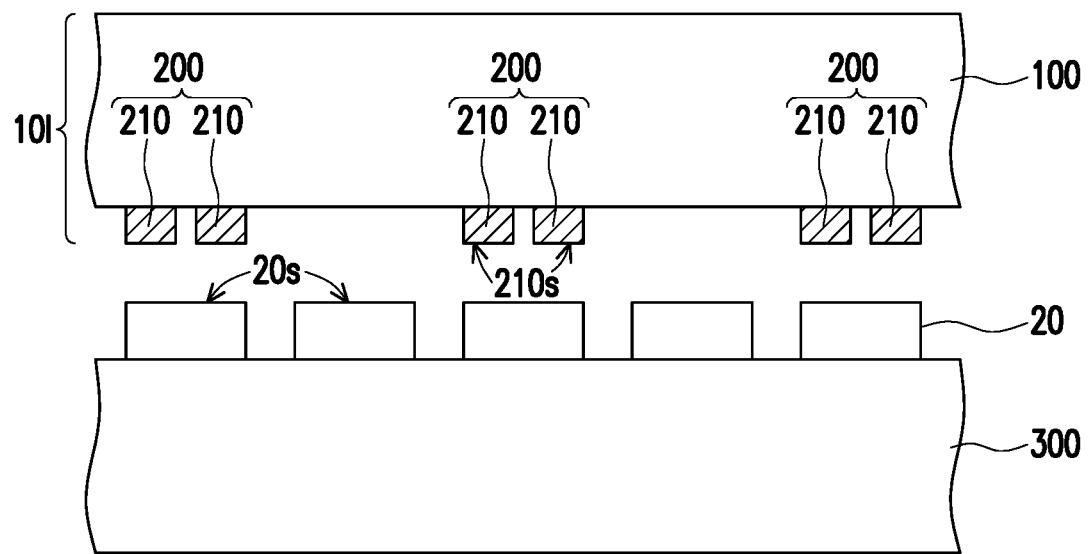
FIG. 18A to FIG. 18E are flowcharts showing the carrier structure of the tenth embodiment of the invention for transferring micro devices.
Figure 18B:
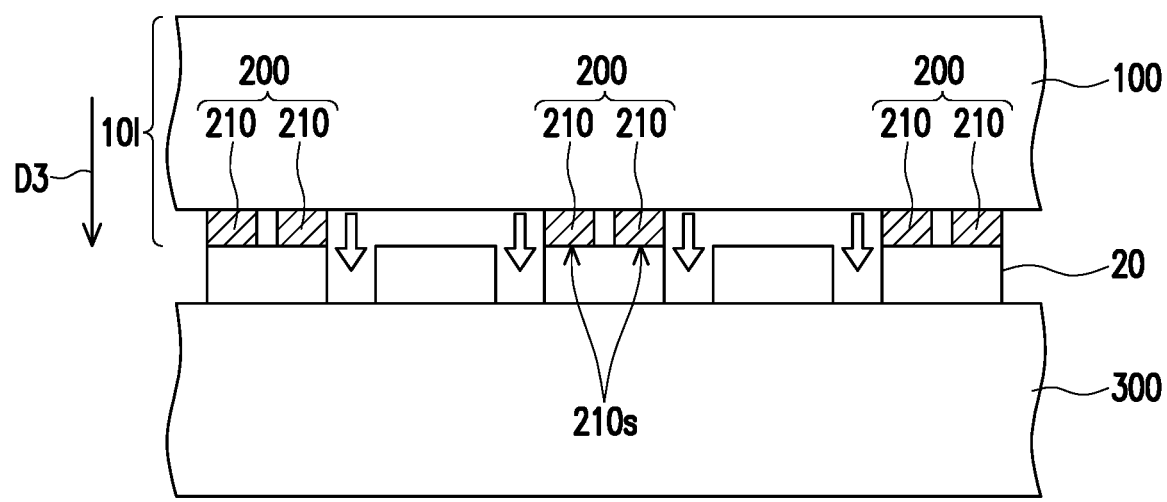
Figure 18C:
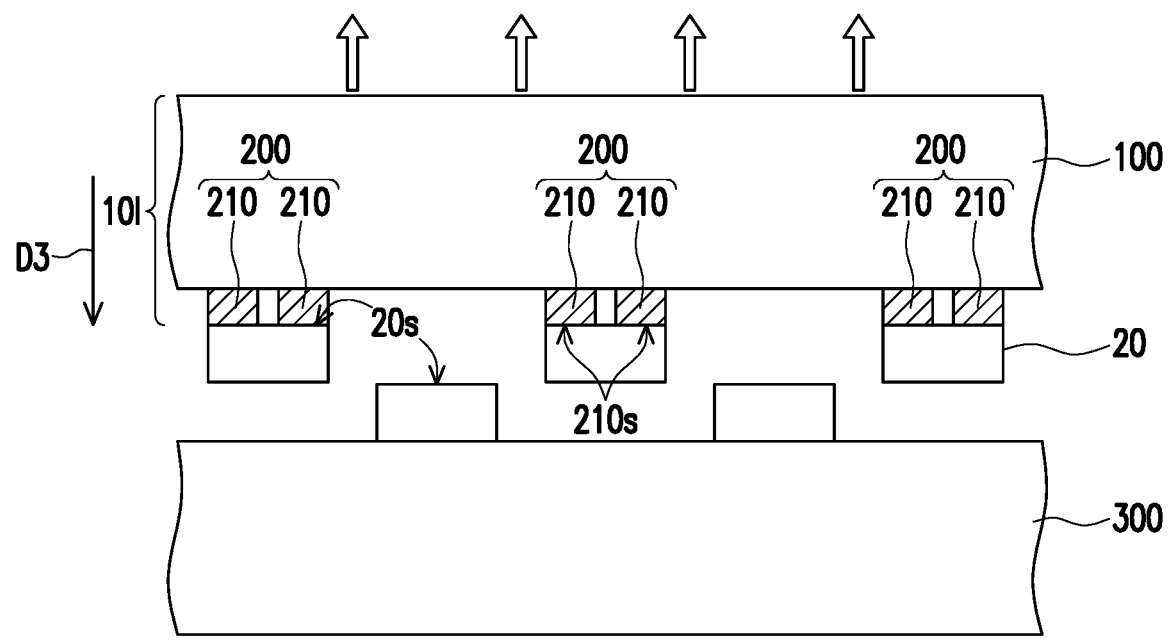
Figure 18D:
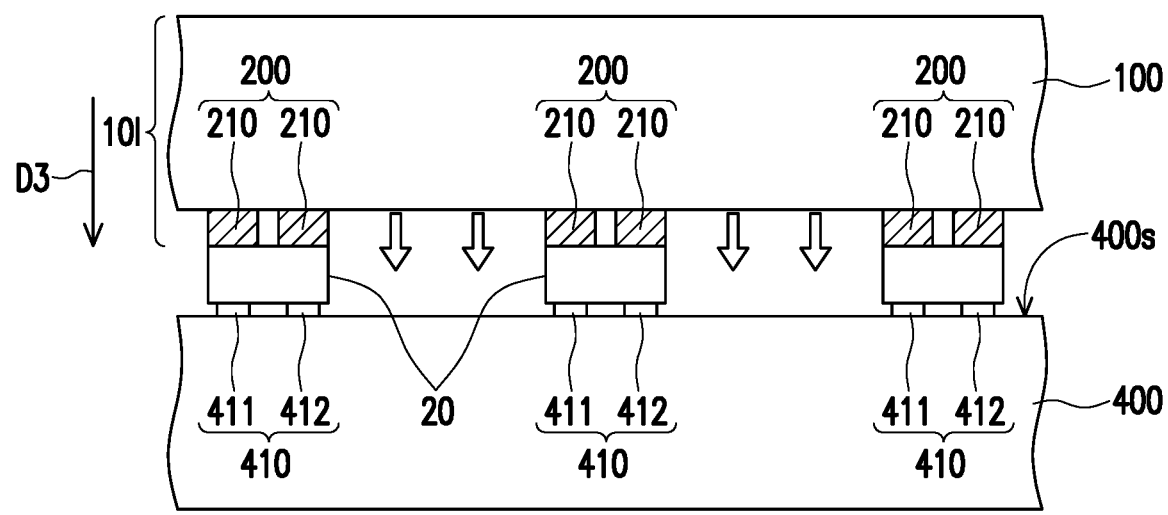
Figure 18E:
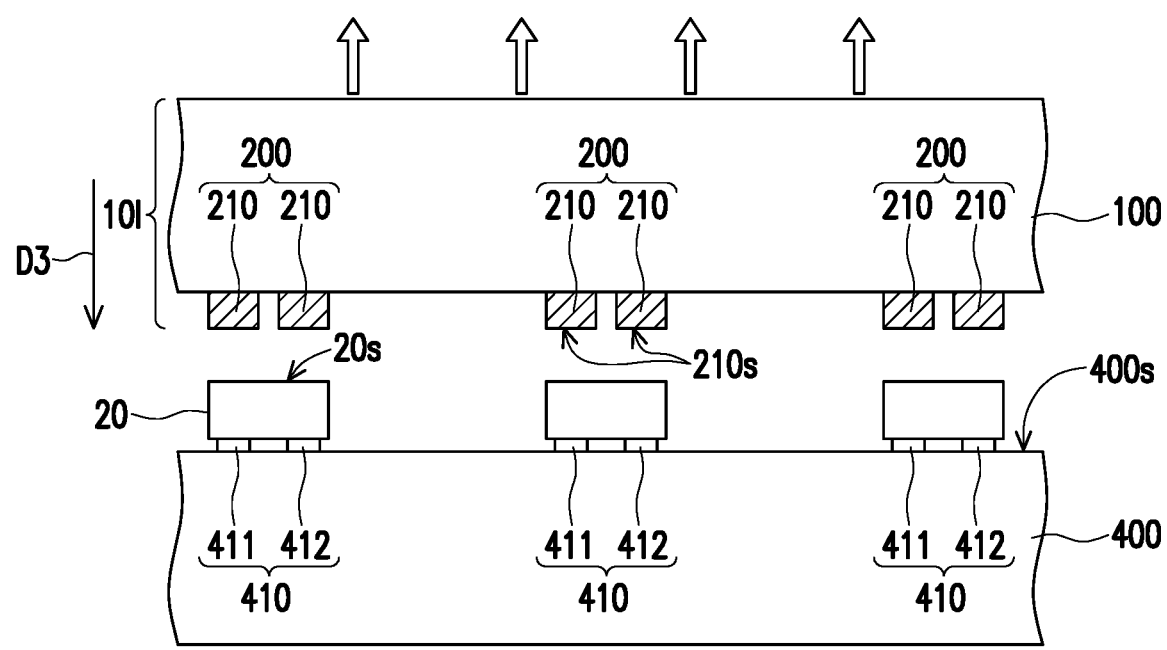

FIG. 16 is a bottom view of a micro device structure 1H of the ninth embodiment of the invention. FIG. 17 is a cross section of the micro device structure 1H of FIG. 16. In particular, FIG. 17 corresponds to section line G-G' of FIG. 16.

Referring to FIG. 16 and FIG. 17, the micro device structure 1H includes a carrier structure 10H. The carrier structure 10H of the present embodiment is different from the carrier structure 10G of FIG. 14 in that the plurality of transfer units 200B of the carrier structure 10H are connected to one another. In this way, the misalignment latitude of the carrier structure 10H in the transfer process (for example, the misalignment in the direction D2 and/or the direction D1) may be further increased.

FIG. 18A to FIG. 18E are flowcharts showing the carrier structure 10I of the tenth embodiment of the invention for transferring the micro devices 20. Referring to FIG. 18A to FIG. 18E, the difference between the carrier structure 10I of the present embodiment and the carrier structure 10 of FIG. 3A is that, during each transfer process, the plurality of transfer units 200 of the carrier structure 10I are only connected to a portion of the micro devices 20 on the temporary substrate 300 and transferred onto the plurality of bonding pad sets 410 of the target substrate 400. For example, in the present embodiment, any two adjacent transfer units 200 may optionally be connected to two corresponding micro devices 20 with one micro device 20 in between, but the invention is not limited thereto. In this way, the partial transfer requirements of the plurality of micro devices 20 may be satisfied, and the setting margin of each of the transfer units 200 on the carrier 100 may be increased.

Based on the above, the carrier structure of an embodiment of the invention may be used for transferring micro devices, or as a temporary substrate for placing micro devices, and by providing a plurality of transfer parts to the transfer units connected to the micro devices and making the area of the transfer surface of each of the transfer parts smaller than the area of the device surface of each of the micro devices, each of the micro devices is stressed more evenly during the transfer process, and the process latitude of the transfer process may be increased. In addition, the micro device structure using the carrier structure may increase the supporting force of the micro devices.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A micro device structure, comprising:
   a carrier structure, comprising:
      a carrier; and
      a plurality of transfer units disposed on the carrier, wherein each of the transfer units comprises a plurality of transfer parts, the transfer parts include an electrical insulation material, and each of the transfer parts has a transfer surface; and
   a plurality of micro devices, wherein each of the micro devices has a device surface, each of the transfer units is located between the carrier and one of the micro devices, the plurality of transfer surfaces of the transfer parts of each of the transfer units are temporarily connected to the device surface of one of the micro devices for transferring the micro device onto a target substrate, and an area of each of the transfer surfaces is smaller than an area of the device surface of one of the micro devices,
   wherein the carrier has a carrier surface and a plurality of grooves, the grooves are located on the carrier surface of the carrier, and the transfer parts are respectively disposed in the grooves.

2. The micro device structure of claim 1, wherein a ratio of the area of each of the transfer surfaces to the area of the device surface of the corresponding micro device is between 0.2 and 0.8.

3. The micro device structure of claim 1, wherein a Young's modulus of each of the transfer parts is less than a Young's modulus of the carrier and a Young's modulus of the corresponding micro device.

4. The micro device structure of claim 1, wherein an overlapped area of the transfer surface of one of the transfer parts of each of the transfer units and the device surface of the corresponding micro device is greater than an overlapped area of the transfer surface of another transfer part and the device surface of the corresponding micro device.

5. The micro device structure of claim 1, wherein an orthographic projection of the transfer parts of each of the transfer units on the carrier is defined as a transfer region, and a ratio of the area of the transfer region to the area of the device surface of the corresponding micro device is greater than or equal to 0.5 and less than or equal to 1.5.

6. The micro device structure of claim 1, wherein any two adjacent transfer units have a first spacing, any two adjacent micro devices have a second spacing, and a ratio of the first spacing to the second spacing is between 0.5 and 1.5.

7. The micro device structure of claim 6, wherein a ratio of the first spacing to a width of each of the micro devices is less than or equal to 0.5.

8. The micro device structure of claim 1, wherein the transfer surface of each of the transfer parts is aligned with the carrier surface.

9. The micro device structure of claim 1, wherein the transfer surface of each of the transfer parts is protruded from the carrier surface.

10. The micro device structure of claim 9, wherein a ratio of a height of the transfer part protruded from the carrier surface to a height of the transfer part is less than or equal to 0.8.

11. The micro device structure of claim 1, wherein each of the transfer parts further has a connection surface connected to the carrier, and a roughness of each of the transfer surfaces is greater than a roughness of the corresponding connection surface.

12. The micro device structure of claim 1, wherein each of the transfer units has at least one housing space, and the transfer parts of each of the transfer units surround at least one corresponding housing space.

13. The micro device structure of claim 12, wherein the transfer units are connected to one another.

14. The micro device structure of claim 1, wherein there is a gap between any two of the transfer parts.

15. The micro device structure of claim 1, wherein there is a gap between the carrier and each of the micro devices.

16. The micro device structure of claim 1, wherein each of the device surface is connected with a plurality of the transfer surfaces.

17. The micro device structure of claim 1, wherein each of the micro devices connects to the carrier structure only with the device surface thereof, and each of the device surfaces is parallel to the transfer surface.

18. A carrier structure suitable for transferring or supporting a plurality of micro devices, the carrier structure comprising:
a carrier; and
a plurality of transfer units disposed on the carrier, wherein each of the transfer units comprises a plurality of transfer parts, the transfer parts include an electrical insulation material, and each of the transfer parts has a transfer surface, wherein each of the micro devices has a device surface, each of the transfer units is located between the carrier and one of the micro devices, the plurality of transfer surfaces of the transfer parts of each of the transfer units are temporarily connected to the device surface of one of the micro devices for transferring the micro device onto a target substrate, and an area of each of the transfer surfaces is smaller than an area of the device surface of one of the micro devices,
wherein the carrier has a carrier surface and a plurality of grooves, the grooves are located on the carrier surface of the carrier, and the transfer parts are respectively disposed in the grooves.

19. The carrier structure of claim 18, wherein the transfer surface of each of the transfer parts is aligned with the carrier surface.

20. The carrier structure of claim 18, wherein the transfer surface of each of the transfer parts is protruded from the carrier surface.

21. The carrier structure of claim 20, wherein a ratio of a height of the transfer part protruded from the carrier surface to a height of the transfer part is less than or equal to 0.8.

22. The carrier structure of claim 18, wherein each of the transfer parts further has a connection surface connected to the carrier, and a roughness of each of the transfer surfaces is greater than a roughness of the corresponding connection surface.

23. The carrier structure of claim 18, wherein each of the transfer units has at least one housing space, and the transfer parts of each of the transfer units surround at least one corresponding housing space.

24. The carrier structure of claim 23, wherein the transfer units are connected to one another.

25. The carrier structure of claim 18, wherein there is a gap between any two of the transfer parts.

26. The carrier structure of claim 18, wherein each of the micro devices connects to the carrier structure only with the device surface thereof, and each of the device surfaces is parallel to the transfer surface.

* * * * *